United States Patent
Hormati

(10) Patent No.: US 10,608,849 B1
(45) Date of Patent: Mar. 31, 2020

(54) VARIABLE GAIN AMPLIFIER AND SAMPLER OFFSET CALIBRATION WITHOUT CLOCK RECOVERY

(71) Applicant: Kandou Labs, S.A., Lausanne (CH)

(72) Inventor: Ali Hormati, Ecublens Vaud (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/378,455

(22) Filed: Apr. 8, 2019

(51) Int. Cl.
  H04L 25/03 (2006.01)
  H03F 3/19 (2006.01)
  H03F 3/45 (2006.01)
  H04L 7/00 (2006.01)

(52) U.S. Cl.
  CPC ......... *H04L 25/03885* (2013.01); *H03F 3/19* (2013.01); *H03F 3/45071* (2013.01); *H04L 7/0025* (2013.01); *H04L 25/03949* (2013.01)

(58) Field of Classification Search
  CPC ...... H03G 3/001; H03G 3/3084; H04L 27/08; H04L 27/3809
  USPC ....................................................... 375/345
  See application file for complete search history.

(56) References Cited

U.S. PATENT DOCUMENTS

| | | | |
|---|---|---|---|
| 3,636,463 A | 1/1972 | Onigkiehong | |
| 3,824,494 A | 7/1974 | Wilcox | |
| 3,939,468 A | 2/1976 | Mastin | |
| 4,276,543 A | 6/1981 | Miller et al. | |
| 4,774,498 A | 9/1988 | Traa | |
| 4,897,657 A | 1/1990 | Brubaker | |
| 5,017,924 A | 5/1991 | Guiberteau et al. | |
| 5,459,465 A | 10/1995 | Kagey | |
| 5,510,736 A | 4/1996 | Van | |
| 5,748,948 A | 5/1998 | Yu et al. | |
| 5,793,254 A | 8/1998 | Oconnor | |
| 5,945,935 A | 8/1999 | Kusumoto et al. | |
| 6,226,330 B1 | 5/2001 | Mansur | |

(Continued)

FOREIGN PATENT DOCUMENTS

WO 2018052657 A1 3/2018

OTHER PUBLICATIONS

Km, Kyu-Young, et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

(Continued)

*Primary Examiner* — Kevin Kim
(74) *Attorney, Agent, or Firm* — Invention Mine LLC

(57) ABSTRACT

Methods and systems are described for generating a time-varying information signal at an output of a variable gain amplifier (VGA), sampling, using a sampler having a vertical decision threshold associated with a target signal amplitude, the time-varying information signal asynchronously to generate a sequence of decisions from varying sampling instants in sequential signaling intervals, the sequence of decisions comprising (i) positive decisions indicating the time-varying information signal is above the target signal amplitude and (ii) negative decisions indicating the time-varying information signal is below the target signal amplitude, accumulating a ratio of positive decisions to negative decisions, and generating a gain feedback control signal to adjust a gain setting of the VGA responsive to a mismatch of the accumulated ratio with respect to a target ratio.

20 Claims, 7 Drawing Sheets

(56) References Cited

U.S. PATENT DOCUMENTS

| | | |
|---|---|---|
| 6,232,908 B1 | 5/2001 | Nakaigawa |
| 6,346,907 B1 | 2/2002 | Dacy et al. |
| 6,384,758 B1 | 5/2002 | Michalski et al. |
| 6,396,329 B1 | 5/2002 | Zerbe |
| 6,400,302 B1 | 6/2002 | Amazeen et al. |
| 6,462,584 B1 | 10/2002 | Proebsting |
| 6,563,382 B1 | 5/2003 | Yang |
| 6,624,699 B2 | 9/2003 | Yin et al. |
| 6,839,587 B2 | 1/2005 | Ponce |
| 6,879,816 B2 | 4/2005 | Bult et al. |
| 6,888,483 B2 | 5/2005 | Mulder |
| 6,972,701 B2 | 12/2005 | Jansson |
| 7,075,996 B2 | 7/2006 | Simon et al. |
| 7,167,523 B2 | 1/2007 | Mansur |
| 7,188,199 B2 | 3/2007 | Leung et al. |
| 7,199,728 B2 | 4/2007 | Dally et al. |
| 7,269,212 B1 | 9/2007 | Chau et al. |
| 7,285,977 B2 | 10/2007 | Kim |
| 7,372,390 B2 | 5/2008 | Yamada |
| 7,397,302 B2 | 7/2008 | Bardsley et al. |
| 7,528,758 B2 | 5/2009 | Ishii |
| 7,656,321 B2 | 2/2010 | Wang |
| 7,683,720 B1 | 3/2010 | Yehui et al. |
| 7,688,102 B2 | 3/2010 | Bae et al. |
| 7,697,915 B2 | 4/2010 | Behzad et al. |
| 7,804,361 B2 | 9/2010 | Lim et al. |
| 7,957,472 B2 | 6/2011 | Wu et al. |
| 8,000,664 B2 | 8/2011 | Khorram |
| 8,030,999 B2 | 10/2011 | Chatterjee et al. |
| 8,106,806 B2 | 1/2012 | Toyomura et al. |
| 8,159,375 B2 | 4/2012 | Abbasfar |
| 8,159,376 B2 | 4/2012 | Abbasfar |
| 8,183,930 B2 | 5/2012 | Kawakami et al. |
| 8,457,261 B1 * | 6/2013 | Shi ............... H03G 3/3078 375/316 |
| 8,547,272 B2 | 10/2013 | Nestler et al. |
| 8,581,824 B2 | 11/2013 | Baek et al. |
| 8,604,879 B2 | 12/2013 | Mourant et al. |
| 8,643,437 B2 | 2/2014 | Chiu et al. |
| 8,674,861 B2 | 3/2014 | Matsuno et al. |
| 8,687,968 B2 | 4/2014 | Nosaka et al. |
| 8,791,735 B1 | 7/2014 | Shibasaki |
| 8,841,936 B2 | 9/2014 | Nakamura |
| 8,860,590 B2 * | 10/2014 | Yamagata ............ H03G 3/3052 327/141 |
| 9,069,995 B1 | 6/2015 | Cronie |
| 9,106,465 B2 | 8/2015 | Walter |
| 9,148,087 B1 | 9/2015 | Tajalli |
| 9,178,503 B2 | 11/2015 | Hsieh |
| 9,281,785 B2 | 3/2016 | Sjöland |
| 9,292,716 B2 | 3/2016 | Winoto et al. |
| 9,300,503 B1 | 3/2016 | Holden et al. |
| 10,003,315 B2 | 6/2018 | Tajalli |
| 2001/0006538 A1 | 7/2001 | Simon et al. |
| 2002/0050861 A1 | 5/2002 | Nguyen et al. |
| 2002/0149508 A1 | 10/2002 | Hamashita |
| 2002/0158789 A1 | 10/2002 | Yoshioka et al. |
| 2002/0174373 A1 | 11/2002 | Chang |
| 2003/0016763 A1 | 1/2003 | Doi et al. |
| 2003/0085763 A1 | 5/2003 | Schrodinger et al. |
| 2003/0132791 A1 | 7/2003 | Hsieh |
| 2003/0160749 A1 | 8/2003 | Tsuchi |
| 2003/0174023 A1 | 9/2003 | Miyasita |
| 2003/0184459 A1 | 10/2003 | Engl |
| 2003/0218558 A1 | 11/2003 | Mulder |
| 2004/0027185 A1 | 2/2004 | Fiedler |
| 2004/0169529 A1 | 9/2004 | Afghani et al. |
| 2005/0057379 A1 | 3/2005 | Jansson |
| 2005/0270098 A1 | 12/2005 | Zhang et al. |
| 2006/0036668 A1 | 2/2006 | Jaussi et al. |
| 2006/0097786 A1 | 5/2006 | Su et al. |
| 2006/0103463 A1 | 5/2006 | Lee et al. |
| 2006/0192598 A1 | 8/2006 | Baird et al. |
| 2006/0194598 A1 | 8/2006 | Kim et al. |
| 2007/0009018 A1 | 1/2007 | Wang |
| 2007/0176708 A1 | 8/2007 | Otsuka et al. |
| 2007/0182487 A1 | 8/2007 | Ozasa et al. |
| 2007/0188367 A1 | 8/2007 | Yamada |
| 2007/0201546 A1 | 8/2007 | Lee |
| 2008/0001626 A1 | 1/2008 | Bae et al. |
| 2008/0165841 A1 | 7/2008 | Wall et al. |
| 2008/0187037 A1 | 8/2008 | Bulzacchelli et al. |
| 2009/0090333 A1 | 4/2009 | Spadafora et al. |
| 2009/0115523 A1 | 5/2009 | Akizuki et al. |
| 2009/0323864 A1 | 12/2009 | Tired |
| 2010/0148819 A1 | 6/2010 | Bae et al. |
| 2010/0156691 A1 | 6/2010 | Taft |
| 2010/0219781 A1 | 9/2010 | Kuwamura |
| 2010/0235673 A1 | 9/2010 | Abbasfar |
| 2010/0271107 A1 | 10/2010 | Tran et al. |
| 2011/0028089 A1 | 2/2011 | Komori |
| 2011/0032977 A1 | 2/2011 | Hsiao et al. |
| 2011/0051854 A1 | 3/2011 | Kizer et al. |
| 2011/0057727 A1 | 3/2011 | Cranford et al. |
| 2011/0096054 A1 | 4/2011 | Cho et al. |
| 2011/0103508 A1 | 5/2011 | Mu et al. |
| 2011/0133816 A1 | 6/2011 | Wu et al. |
| 2011/0156819 A1 | 6/2011 | Kim et al. |
| 2012/0025911 A1 | 2/2012 | Zhao et al. |
| 2012/0044021 A1 | 2/2012 | Yeh et al. |
| 2012/0133438 A1 | 5/2012 | Tsuchi et al. |
| 2013/0106513 A1 | 5/2013 | Cyrusian et al. |
| 2013/0114663 A1 | 5/2013 | Ding et al. |
| 2013/0147553 A1 | 6/2013 | Iwamoto |
| 2013/0195155 A1 | 8/2013 | Pan et al. |
| 2013/0215954 A1 | 8/2013 | Beukema et al. |
| 2013/0259113 A1 | 10/2013 | Kumar |
| 2013/0334985 A1 | 12/2013 | Kim et al. |
| 2014/0119479 A1 | 5/2014 | Tajalli |
| 2014/0176354 A1 | 6/2014 | Yang |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |
| 2016/0013954 A1 | 1/2016 | Shokrollahi et al. |
| 2016/0197747 A1 | 7/2016 | Ulrich et al. |
| 2017/0085239 A1 | 3/2017 | Yuan et al. |
| 2017/0104458 A1 | 4/2017 | Cohen et al. |
| 2017/0214374 A1 | 7/2017 | Tajalli |
| 2019/0199557 A1 | 6/2019 | Taylor et al. |

OTHER PUBLICATIONS

Takahashi, Masayoshi , et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Wang, Hui , et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

Anadigm , "Using the Anadigm Multiplier CAM", Design Brief 208, www.anadigm.com, Copyright 2002, 2002, (6 pages).

Schneider, J. , et al., ""ELEC301 Project: Building an Analog Computer"", http://www.clear.rice.edu/elec301/Projects99/anlgcomp/, Dec. 19, 1999, (9 pages).

Tierney, J. , "A Digital Frequency Synthesizer", Audio and Electroacoustics, IEEE Transactions, pp. 48-57, vol. 19, No. 1, Abstract, Mar. 1971, (1 page).

Palmisano, G. , et al., "A Replica Biasing for Constant-Gain CMOS Open-Loop Amplifiers", Circuits and Systems, IEEE International Symposium in Monterey, CA, May 31, 1998, 363-366 (4 pages).

\* cited by examiner

VARIABLE GAIN AMPLIFIER AND SAMPLER OFFSET CALIBRATION WITHOUT CLOCK RECOVERY

REFERENCES

The following prior applications are herein incorporated by reference in their entirety for all purposes:

U.S. Pat. No. 9,100,232, filed Feb. 2, 2105 as application Ser. No. 14/612,241 and issued Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi].

U.S. patent application Ser. No. 15/582,545, filed Apr. 28, 2017, naming Ali Hormati and Richard Simpson, entitled "Clock Data Recovery Utilizing Decision Feedback Equalization", hereinafter identified as [Hormati].

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods such as described in [Shokrollahi] have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions. It is common for communications receivers to extract a receive clock signal from the received data stream. Some communications protocols facilitate such Clock Data Recovery or CDR operation by constraining the communications signaling so as to distinguish between clock-related and data-related signal components. Similarly, some communications receivers process the received signals beyond the minimum necessary to detect data, so as to provide the additional information to facilitate clock recovery. As one example, a so-called double-baud-rate receive sampler may measure received signal levels at twice the expected data reception rate, to allow independent detection of the received signal level corresponding to the data component, and the chronologically offset received signal transition related to the signal clock component.

Real-world communications channels are imperfect, degrading transmitted signals in both amplitude (e.g. attenuation) and timing (e.g. delay and pulse smearing) which may be addressed via transmitter pre-compensation and/or receive equalization. Continuous time linear equalization (CTLE) is one known approach to frequency domain equalization, in one example providing compensation for increased channel attenuation at high frequencies. Time-domain-oriented equalization methods are also used to compensate for the effects of inter-symbol-interference or ISI on the received signal. Such ISI is caused by the residual electrical effects of a previously transmitted signal persisting in the communications transmission medium, so as to affect the amplitude or timing of the current symbol interval. As one example, a transmission line medium having one or more impedance anomalies may introduce signal reflections. Thus, a transmitted signal will propagate over the medium and be partially reflected by one or more such anomalies, with such reflections appearing at the receiver at a later time in superposition with signals propagating directly.

One method of data-dependent receive equalization is Decision Feedback Equalization or DFE. Here, the time-domain oriented equalization is performed by maintaining a history of previously-received data values at the receiver, which are processed by a transmission line model to predict the expected influence that each of the historical data values would have on the present receive signal. Such a transmission line model may be precalculated, derived by measurement, or generated heuristically, and may encompass the effects of one or more than one previous data interval. The predicted influence of these one or more previous data intervals is collectively called the DFE compensation. At low to moderate data rates, the DFE compensation may be calculated in time to be applied before the next data sample is detected, as example by being explicitly subtracted from the received data signal prior to receive sampling, or implicitly subtracted by modifying the reference level to which the received data signal is compared in the receive data sampler or comparator. However, at higher data rates the detection of previous data bits and computation of the DFE compensation may not be complete in time for the next data sample, requiring use of so-called "unrolled" DFE computations performed on speculative or potential data values rather than known previous data values. As one example, an unrolled DFE stage may predict two different compensation values depending on whether the determining data bit will resolve to a one or a zero, with the receive detector performing sampling or slicing operations based on each of those predictions, the multiple results being maintained until the DFE decision is resolved.

BRIEF DESCRIPTION

A digital receiver system samples received signals in both amplitude and time, obtaining sufficient information to permit accurate detection and decoding of the transmitted data regardless of signal degradations induced by the communications medium. As the communications medium may introduce significant signal attenuation, signal receivers often incorporate variable gain amplifiers to restore detectable signal levels. Setting the correct gain level on such amplifiers enables signal detection. Methods and systems are described herein for performing measurements on and adjustments of variable gain amplifier gain settings that operates before fully synchronous receiver operation begins.

Methods and systems are described for generating a time-varying information signal at an output of a variable gain amplifier (VGA), sampling, using a sampler having a vertical decision threshold associated with a target signal amplitude, the time-varying information signal asynchronously to generate a sequence of decisions from varying sampling instants in sequential signaling intervals, the sequence of decisions comprising (i) positive decisions indicating the time-varying information signal is above the target signal amplitude and (ii) negative decisions indicating the time-varying information signal is below the target signal amplitude, accumulating a ratio of positive decisions to negative decisions, and generating a gain feedback control signal to adjust a gain setting of the VGA responsive to a mismatch of the accumulated ratio with respect to a target ratio.

DETAILED DESCRIPTION

Figure 1:
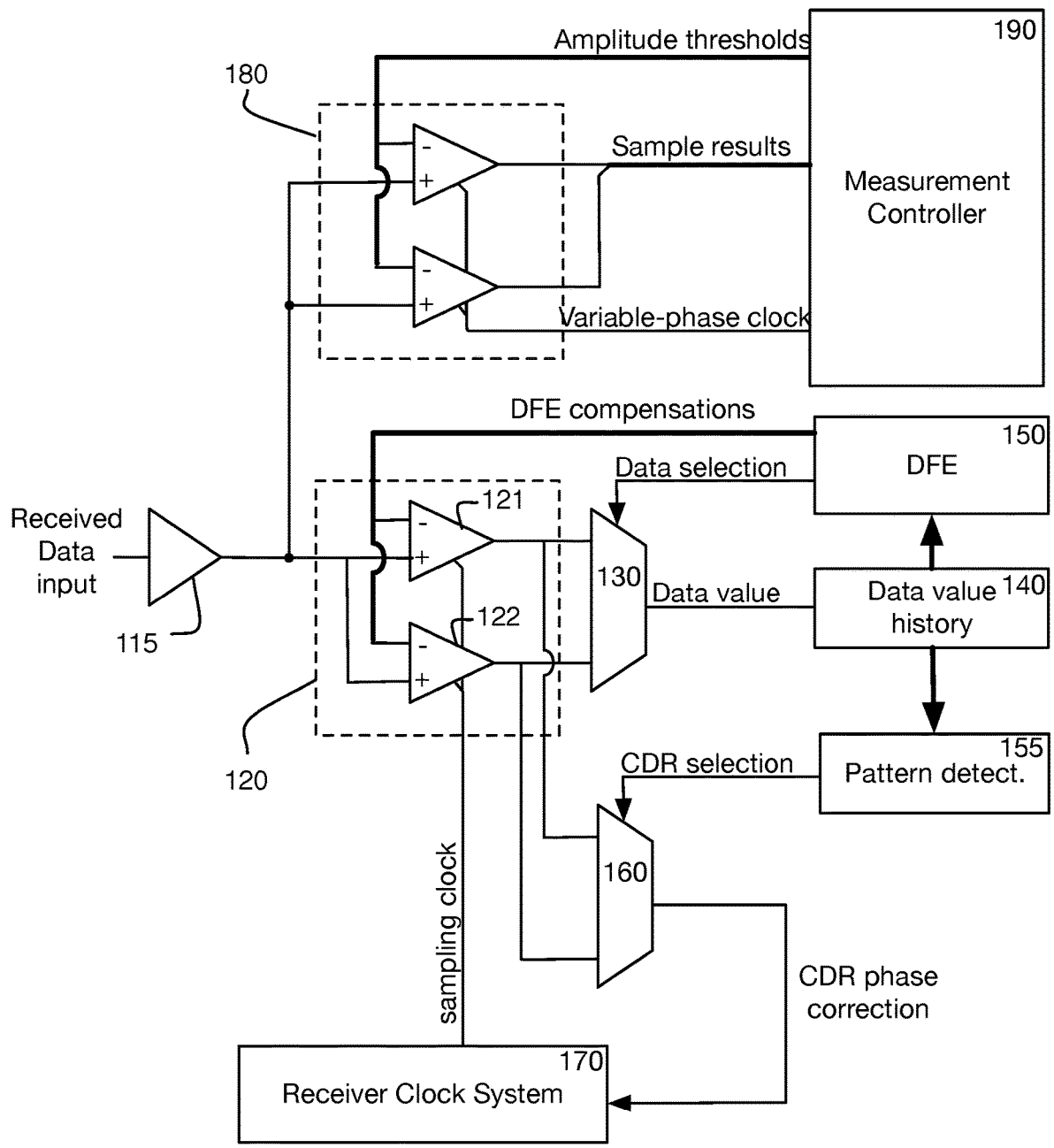
FIG. 1 is a block diagram of a receiver, in accordance with some embodiments.

In recent years, the signaling rate of high speed communications systems have reached speeds of tens of gigabits per second, with individual data unit intervals measured in picoseconds. One example of such a system is given by [Shokrollahi], which describes use of vector signaling codes over extremely high bandwidth multiwire data communications links, such as between two integrated circuit devices in a system. Depending on the particular coding scheme used, the number of channels comprising such a communications link may range from two to eight or more, and may also communicate one or more clock signals, either within data channels or on separate communications channels.

In one embodiment utilizing a vector signaling code, multiple bits of data are encoded at the transmitter into a vector signaling "codeword", i.e. a set of symbols to be transmitted essentially simultaneously over the multiple wires or channels of the communication medium. As each such wire or channel may take on more than two possible values, each symbol of the codeword is drawn from an alphabet of allowable signal values; in examples of [Shokrollahi], alphabets of four and ten values are used in encodings of five data bits into six symbol codewords. In the receiver, the multilevel wire signals are detected to determine the received codeword, which is then decoded (e.g. by a mapping table lookup) into received data.

In an alternative embodiment, it is noted that each vector signaling codeword is a superposition of "subchannel" components, each such subchannel being an orthogonal mode or pattern of modulation of the wires or channels. Thus, in the example of [Shokrollahi], five subchannels may be summed to produce the transmitted signals, each subchannel modulated by one of the five transmitted data bits. Similarly, a vector signaling code receiver may directly detect the combination of received wire signals corresponding to a particular subchannel, as one example by using a multi-input comparator (MIC) performing a weighted summation of two or more wire signals correlated with the orthogonal mode of that subchannel, and directly producing one bit of received data. In the example of [Shokrollahi], full decoding of five data bits is shown using a set of MICs combining from two to six wire signals. As codeword and subchannel processing models are fully equivalent, interoperation is assured regardless of the particular encoding and decoding model used, e.g. allowing combination of a codeword transmitter with a MIC-based subchannel receiver based on the same orthogonal vector signaling code.

As previously mentioned, wire signals in an orthogonal vector signaling code system may take on multiple distinct values, while detected subchannel results (as one example, the results of weighted summation as at the output of a MIC) are typically binary, thus receive processing functions such as ISI reduction and skew correction may be performed more efficiently on the simpler subchannel signals rather than on the more complex wire signals.

Conventional practice for a high-speed integrated circuit receiver terminates each received signal channel, subchannel, or wire signal in a sampling device. This sampling device performs a measurement constrained in both time and amplitude dimensions; in one example embodiment, it may be composed of a sample-and-hold circuit that constrains the time interval being measured, followed by a threshold detector or digital comparator that determines whether the signal within that interval falls above or below (or in some embodiments, within bounds set by) a reference value. Alternatively, a digital comparator may determine the signal amplitude followed by a clocked digital flip-flop capturing the result at a selected time. In other embodiments, a combined time- and amplitude-sampling circuit is used, sampling the amplitude state of its input in response to a clock transition. In some embodiments, the time at which a sample is captured may be adjusted in some or all of the receiver samplers; in some embodiments, the threshold level to which a sample is compared may be adjusted, in some or all of the receiver samplers.

For descriptive convenience, this document will use the term sampling device, or more simply "sampler" to describe the receiver component that obtains an input measurement, as it implies both the time and amplitude measurement constraints, rather than the equivalent but less descriptive term "slicer" also used in the art. In some embodiments, the time at which a sample is captured may be adjusted in some or all of the receiver samplers; in some embodiments, the threshold level to which a sample is compared may be adjusted in some or all of the receiver samplers. As one example, the well-known receiver "eye plot" diagram is typically obtained by iterative adjustment of these parameters, with the results plotted graphically as signal amplitudes over time.

Embodiments described herein can also be applied to prior art permutation sorting methods not covered by the vector processing methods of [Shokrollahi]. More generally, embodiments may apply to any communication or storage methods, in particular those requiring coordination of multiple channels or elements of the channel to produce a coherent aggregate result.

Clock Data Recovery

Clock Data Recovery or Clock Data Alignment (CDR or CDA) circuits as in [Hormati] extract timing information, either from the data lines themselves or from dedicated clock signal inputs, and utilizing that extracted information to generate clock signals to control the time interval used by received signal sampling device. The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. Implementation distinctions between CDR and CDA embodiments as described in the art are irrelevant to the present descriptions, thus the term CDA will subsequently be used herein as a generic identifier, without implying limitation.

In one common CDA embodiment, a first sample time is configured to optimally obtain the data sample, and a second sample time is configured to optimally determine whether the phase of the internal clock remains aligned with incoming signal transitions, which may be as much as ½ of a received signal unit interval (UI) offset in time from the optimum data sampling time. As sampling in such embodiments occurs twice per received unit interval, such systems are described as utilizing a double baud rate CDA. Such systems are very common in low speed communications system or where the received signal exhibits very sharp transitions, i.e. where there is significant displacement in time between observation of a signal transition and optimum sampling of data. More advanced CDA systems may utilize a single sample time to obtain both data and clock phase information.

Receive Signal Equalization

At high data rates, even relatively short and high-quality communications channels exhibit considerable frequency-dependent signal loss, thus it is common for data receivers to incorporate receive signal equalization. Continuous-time Linear Equalization (CTLE) is commonly used to provide increased high frequency gain in the receive signal path, in compensation for the increased high frequency attenuation of the channel. Signal path attenuation may also require additional signal amplification at the receiver to provide sufficient signal amplitude for detection. Such embodiments will typically include a Variable Gain Amplifier or VGA in the receive signal path.

Example Embodiment

For purposes of description and without implying limitation, a simple serial data receiver as shown in FIG. 1 will be used as an example. This example receiver includes at least one stage of speculative DFE 150 supported by two data samplers performing concurrent time-sampling operations at two different amplitude thresholds, and a receiver clock system 170 to produce a sampling clock, the phase of which may be adjusted by a CDR correction to optimize data sampling timing. As shown, the data samplers include comparators 120 sampling the received signal provided by variable gain amplifier (VGA) 115 according to the sampling clock. Before sampling, the received signal may be equalized by a continuous time linear equalizer (CTLE, not shown).

In some embodiments, an apparatus includes two comparators 120 configured to generate two comparator outputs, the two comparators configured to compare a received time-varying information signal to a first threshold as at 121 and a second threshold as at 122, according to a sampling clock. The first and second thresholds may correspond to decision feedback equalization (DFE) factors that are determined by an estimated amount of inter-symbol interference on a multi-wire bus. The apparatus may further include a data decision selection circuit 130 configured to select one of the two comparator outputs as a data decision, the selection based on at least one prior data decision that may be stored in data value history 140. The apparatus further includes a phase-error indication selection circuit 160 configured to select one of the two comparator outputs as a phase-error indication in response to receiving a CDR selection signal from a pattern detection circuit 155 configured to identify a predetermined data decision pattern in the data value history storage 140.

In some embodiments, one or more spare samplers 180 provide enhanced measurement capability. In one mode, one or more of spare samplers 180 may be configured to act as a replacement data sampler, allowing a data sampler to be taken off-line for calibration, adjustment, or other operational maintenance use. In another mode, one or more spare samplers 180 may be configured to gather eye scope data, using Amplitude threshold(s) and/or a Sample clock other than that of a data sampler, as provided by Measurement Controller 190. In a further mode, Measurement Controller 190 may configure one or more spare samplers 180 to obtain non-intrusive measurements of received signal amplitudes or transition timing.

In some embodiments, the apparatus further includes a receiver clock system 170 configured to receive the phase-error indication and to responsively adjust a phase of the sampling clock. In some embodiments, the phase-error indication is an early/late logic decision on a transition of the received signal. In some embodiments, the data decision selection circuit 130 and phase-error indication circuit 160 select different comparator outputs.

In some embodiments, the apparatus further includes a decision-feedback equalization (DFE) circuit 150 configured to generate the first and second thresholds.

In some embodiments, the apparatus further includes a sub-channel detection multi-input comparator (MIC, not shown) operating on signals received via a plurality of wires, the sub-channel detection MIC configured to generate the received data input signal. In such embodiments, the signals received via the plurality of wires correspond to symbols of a codeword of a vector signaling code, the codeword corresponding to a weighted summation of a plurality of sub-channel vectors, each sub-channel vector mutually orthogonal. In such an embodiment, the inter-symbol interference is sub-channel specific, the sub-channel specific ISI corresponding to modulation of components of a corresponding sub-channel vector associated with the received signal. In some embodiments, sub-channel specific ISI associated with each sub-channel vector is mutually orthogonal. In some embodiments, the apparatus may further include a filter configured to filter the received signal prior to generating the comparator outputs.

In some embodiments, at least the data samplers 120 of FIG. 1 are duplicated 180 so as to permit one set of data samplers measuring a received signal to provide an uninterrupted stream of detected data, while another set of data samplers measuring the same received signal obtains non-data results, such as signal amplitude or clock phase information. In further embodiments, at least one of the comparator threshold(s), sample timing, receive channel gain, and CTLE equalization are modified for at least one set of data samplers during said measurement and/or adjustment.

VGA Gain Adjustment without CDR

During initial startup or initialization of the data receiver, the communication channel characteristics may be unknown, in particular it is not known how much the time-varying information signal generated by the transmitting device has been attenuated, thus providing no indication of how much receiver front-end gain (e.g. from a variable-gain input amplifier or VGA) should be applied to provide an acceptable input signal for the receive data detectors.

In the absence of a detected data stream, the receive clock or CDA subsystem may not phase lock, and may thus typically free-run at some frequency that may be significantly different than that of the transmitted data stream, precluding normal use of receive signal samplers. In some embodiments, the free-running rate of the receiver's phase lock loop clock system may approximate that of the transmitter, as one example within 20% of nominal frequency. In other embodiments, the initial rate of the PLL may be substantially different, in some instances a factor of two or more higher or lower in frequency. This is particularly problematic with CDA embodiments extracting timing information from received data transitions, as the phase error signal obtained from one of the samplers 120 that is provided to obtain PLL lock is derived at least in part from correct detection of data values from the received time-varying information signal, where such detection operates according to an accurately aligned clock signal obtained from the PLL.

Many receiver systems do not provide any hardware support allowing actual measurement of signal amplitudes. Instead, the data sampler(s) merely indicate whether, at the time they are triggered by the sampling clock, the input signal was above or below the sampler threshold. Without CDA lock, it is not known where a given measurement of the time-varying information signal is made during a given signaling interval, each such measurement being made at what are essentially arbitrary moments in each sequential signaling interval.

One embodiment takes advantage of the lack of sampling clock lock during this initial startup period to allow the data samplers to statistically estimate overall input signal amplitude, and thus to estimate the upper and lower bounds for the time-varying information signal. If the receiver sampling clock were locked as in normal data detector operation, these upper and lower bounds would typically be described as "top of eye" and "bottom of eye", referencing elements of the well-known eye diagram model for received signal detection. As the clock is not locked, the time-varying information signal is sampled asynchronously, and the relationship between the asynchronous samples and the sampling time at the center of the eye as will be determined by the CDR are arbitrary and will vary from sample to sample.

Figure 6:
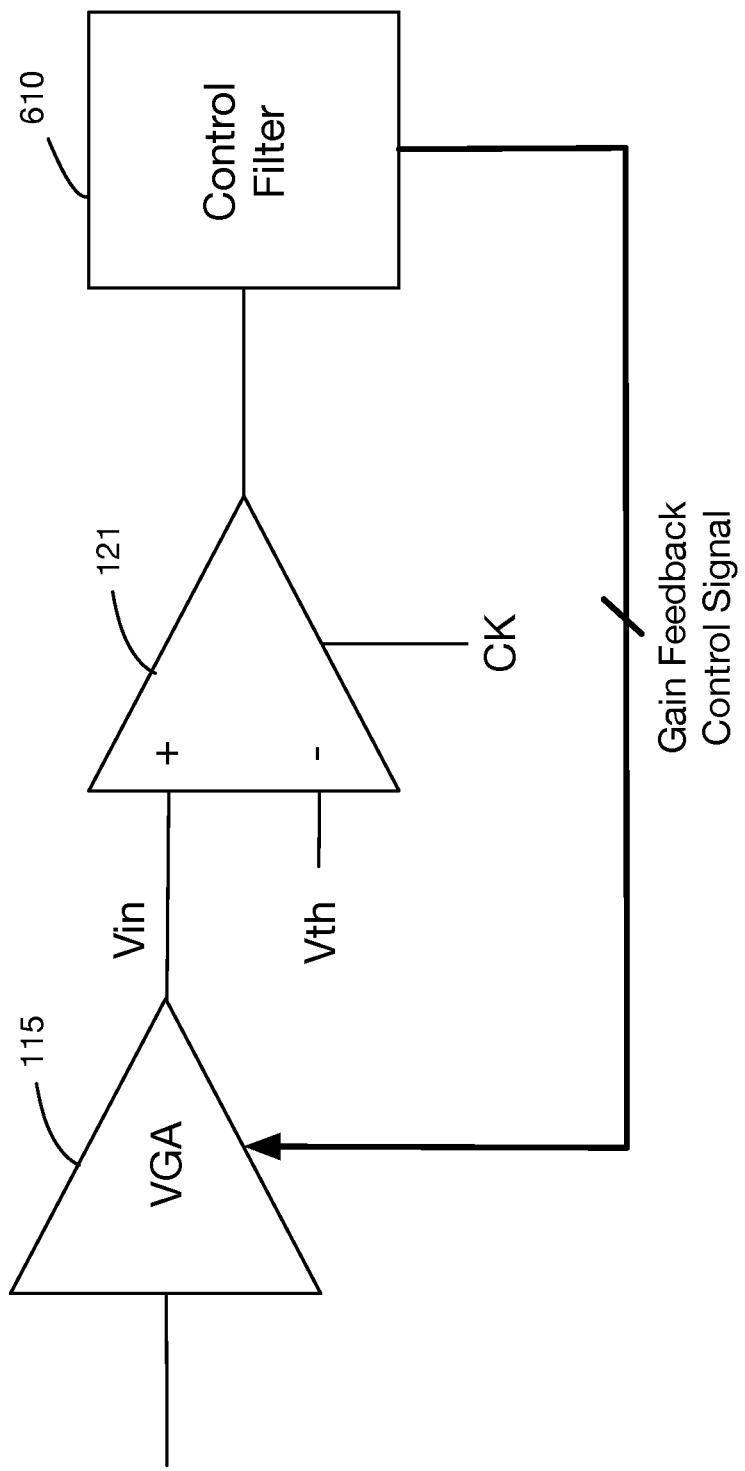
FIG. 6 is a block diagram of an apparatus for variable gain amplifier (VGA) gain calibration without clock and data recovery (CDR), in accordance with some embodiments.

FIG. 6 is a block diagram of an apparatus, in accordance with some embodiments. As shown, FIG. 6 includes a VGA 115 configured to generate a time-varying information signal Vin. FIG. 6 further includes a sampler, e.g., sampler 121 of FIG. 1, having a vertical decision threshold Vth associated with a target signal amplitude. Sampler 121 is configured to asynchronously sample the time-varying information signal using sampling clock CK, which has not yet been locked by the CDR, to generate a sequence of decisions from varying sampling instants in sequential signaling intervals, the sequence of decisions comprising (i) positive decisions indicating the time-varying information signal is above the target signal amplitude and (ii) negative decisions indicating the time-varying information signal is below the target signal amplitude. FIG. 6 further includes a control filter 610 configured to accumulate a ratio of positive decisions to negative decisions, and to responsively generate a gain feedback control signal to adjust a gain setting of the VGA responsive to a mismatch of the accumulated ratio with respect to a target ratio. In some embodiments, the gain feedback control signal may be a multi-bit control signal selected from an MSB portion of a counting register in the control filter. In alternative embodiments, the gain feedback control signal may be a single bit for incrementing or decrementing the gain setting of the VGA by a single step.

Figure 4:
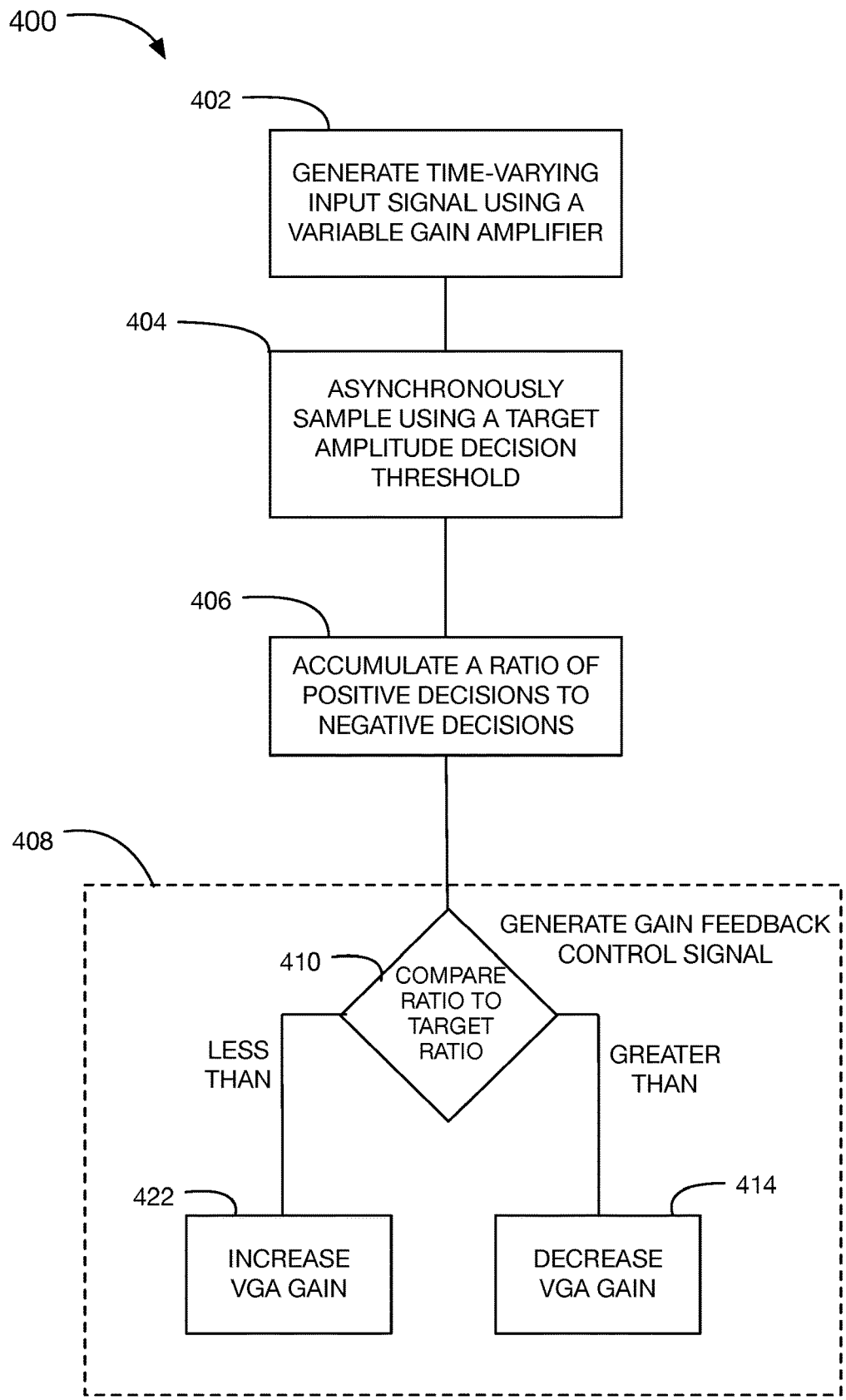
FIG. 4 is a flowchart of a method, in accordance with some embodiments.
Figure 5:
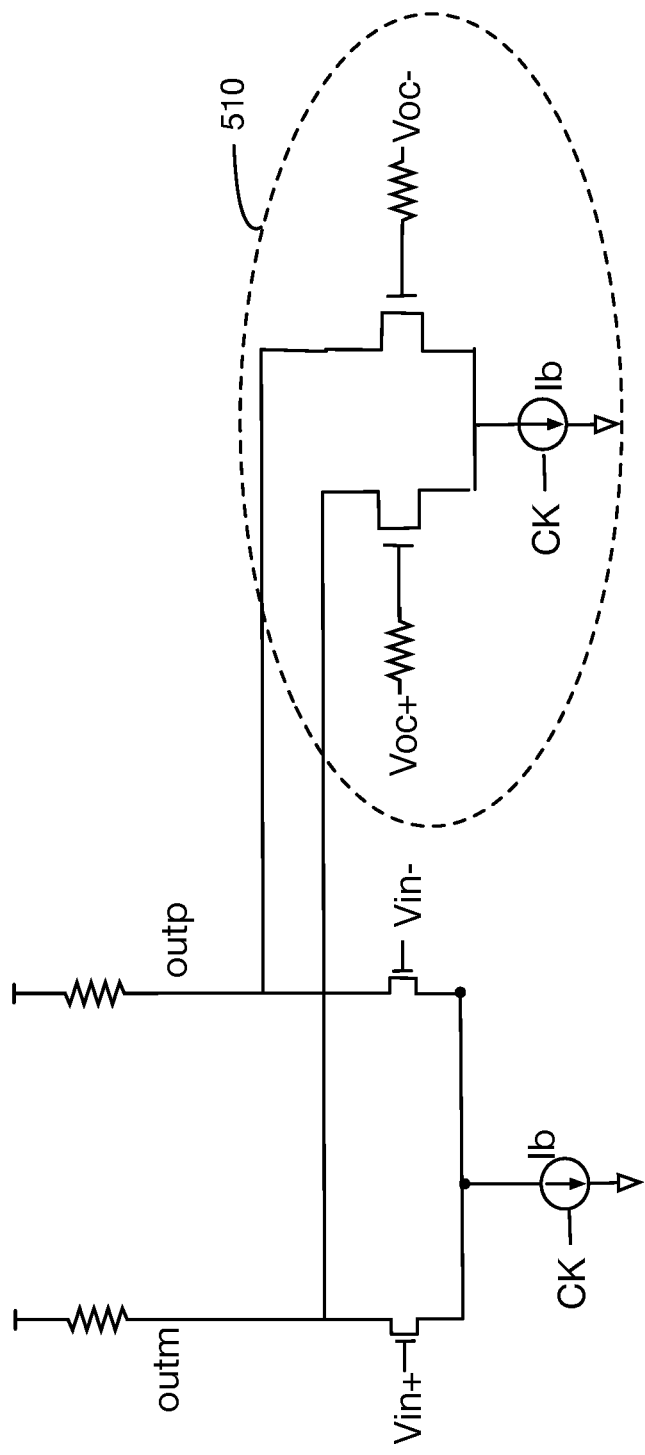
FIG. 5 is a schematic of a differential sampler connected to an offset differential pair, in accordance with some embodiments.

FIG. 4 includes a method 400, in accordance with some embodiments. As shown, method 400 includes generating 402 a time-varying information signal at an output of a VGA. In some embodiments, the time-varying information signal may be an arbitrary data signal, or alternatively a training pattern. In one particular embodiment, an initial top-of-eye target of 200 mV is desired to allow proper data detection by the samplers in normal data operation. In this asynchronous startup procedure, the sampler vertical decision threshold is adjusted to the target signal amplitude, and a number of samples are taken 404 to generate a sequence of decisions from varying sampling instants in sequential signaling intervals. In one particular embodiment, setting the sampler threshold includes applying a voltage offset via an offset differential pair. In some embodiments, the target signal amplitude corresponds to a target peak-to-peak signal amplitude. For example, FIG. 5 illustrates a schematic in accordance with one particular embodiment, in which the sampler threshold has an offset applied via the offset correction differential pair 510. In some embodiments, the voltage offset Voc may correspond to the target signal amplitude, while in some embodiments, Voc may correspond to a DFE correction factor. In some embodiments, the voltage offset may be applied via adjustment of current sources in the differential pair. As CDR has not yet produced a clock signal from phase-error information generated from the samplers 120, the timing of these samples is essentially random with respect to amplitude changes in the incoming data stream, thus the collection of numerous such samples provides a reasonable estimate of overall signal amplitudes across the entire signaling interval. The sequence of decisions generated by the sampler includes (i) "positive" or "above-threshold" decisions indicating that the time-varying information signal is above the target signal amplitude and (ii) "negative" or "below-threshold" decisions indicating that the time-varying information signal is below the target signal amplitude. The method further includes accumulating 406 a ratio of positive decisions to negative decisions, and responsively generating 408 a gain feedback control signal to adjust a gain setting of the VGA responsive to a mismatch of the accumulated ratio to a target ratio. As shown in FIG. 4, generating the gain feedback control signal 408 may include comparing 410 the accumulated ratio of decisions to a predetermined target ratio. If the accumulated ratio of decisions above versus decisions below the target signal amplitude is much less than the target ratio, e.g. 1:8, the VGA gain is increased 412, and the measurement repeated. If the accumulated ratio of decisions is much greater than the predetermined ratio or target ratio, the VGA gain is reduced 414 and the measurement repeated.

A further embodiment utilizes a control filter to accumulate the statistical samples and to apply the target ratio using e.g., a hardware counting register. Continuing the previous example, the example target ratio of 1:8 essentially implies that eight below-threshold samples are equivalent to one above-threshold sample for the purposes of this statistical analysis. Thus, this embodiment divides the count of below-threshold decisions by eight (e.g. by accumulating counts in a three bit binary counter prior to the comparison function) and accumulates the ratio of above-threshold decisions to (the pre-scaled or divided) below-threshold samples using a binary up/down counter: counting down for each above-threshold decisions, and up for each eight below-threshold decisions. If the counter value remains approximately at the value to which it was initialized before the measurement procedure, the number of up counts is approximately the same as the number of down counts, thus the measurement results were obtained approximately in the target ratio. If the counter value increases appreciably, the number of sampled below-threshold results exceeded the expectations set by the target ratio, and if the counter value decreases appreciably, the number of sampled above-threshold decisions exceeded the expectations set by the target ratio.

One particular embodiment combines the initial divide-by-N divider and up/down result counter into a single special-purpose hardware counting register, in which as one example "below threshold" decisions increments the counter starting at its least-significant or first counting register bit with any resulting low-order-bits counter overflows cascading as usual to increment higher-order counting register bits, and "above threshold" decisions decrements the counting register starting after the $\log_2(N)$'th counting register bit (i.e. in this example, by introducing the decrement operation into the counter carry logic between the $3^{rd}$ and $4^{th}$ counter bits.)

The resulting effect is that each below threshold decision increases the overall counter value by one, while each above threshold decision decreases the overall counter value by eight. The most-significant bit (MSB) of the up/down counter is used as the result indicator, and the overall size of the counter is chosen such that the number of statistical samples taken will not cause the results portion of the counter to overflow. In one particular embodiment, the measurement procedure is continued until a statistically valid ratio of measurement decisions has been accumulated. For each measurement decision, if the sampler output is '0' (i.e., the time-varying information signal is below the decision threshold) the counter is incremented starting at its least-significant or $2^0$ bit, increasing its overall value by 1. If the sampler output is '1' (i.e., the time-varying information signal is above the decision threshold) the counter is decremented starting at its $2^3$ bit, effectively decrementing the overall counter value by 8. After a statistically valid number of samples have been obtained, the MSB of the counter is examined to determine if the gain setting of the VGA should be increased (e.g., MSB=0) or decreased (e.g., MSB=1), via e.g., a gain feedback control signal. In some embodiments, the gain feedback control signal may correspond to a single bit to update the gain setting of the VGA by a single step. Alternatively, an MSB portion of the counter may correspond to a multi-bit gain feedback control signal for controlling the gain setting of the VGA.

Figure 2:
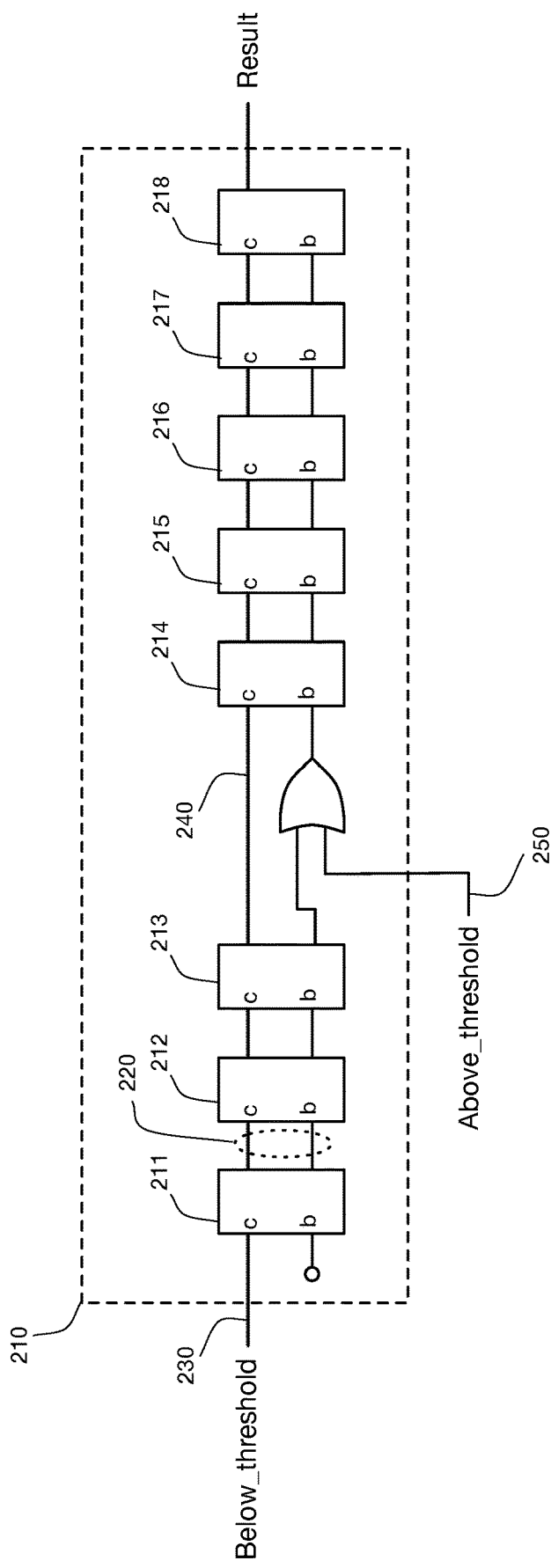
FIG. 2 is a block diagram of one embodiment of a counting register accumulating a ratio of measurement results, in accordance with some embodiments.

FIG. 2 is block diagram illustrating one embodiment of this counter logic, where up/down counter 210 is implemented as a collection of flip-flops 211, 212, 213, 214, 215, 216, 217, 218 interconnected by carry/borrow (i.e. count-up and count-down) signals 'c' and 'b' respectively such as shown at 220. As shown, negative or "Below threshold" decisions 230 indicating the time-varying information signal is below the target signal amplitude act upon the least-significant bit 211 of counter 210, initiating an overall counter increment or "count up" operation. For each eight such count up operations, the sub-counter comprised of 211, 212, 213 will produce a carry overflow signal 240 causing the sub-counter comprised of 214 through 218 to increment or count up. Positive or "Above threshold" decisions 250 indicating the time-varying information signal also act upon the interface between 213 and 214, introducing an extra "borrow" signal causing the sub-counter composed of 214 through 218 to decrement or count down. As shown, the positive and negative decisions affect positions of the counting register that are separated according to the target ratio—in this particular example $1:2^3$, or 1:8.

As implementing an up/down counter operating at high speeds can be difficult, an alternative embodiment eschews an exact ratiometric calculation and instead implements a fast approximation. It may be observed that introducing a counter decrement operation following the $\log_2(N)$'th counter bit uses both carry and borrow operations between counter stages, i.e. implementation of a full set of up/down counter logic. If instead the counter is implemented as a simple up-counting cascade of flip-flops (either ripple-carry, or look-ahead carry as appropriate to the instantiation) below-threshold decision may initiate count operations starting at the LSB and cascading as appropriate to higher-order bits.

As before, the first $\log_2(N)$ bits of the counter are implied to implement the divide-by-N function associated with the chosen 1:N target ratio. Rather than introducing a decrement operation, however, each above-threshold decision clears or sets to zero each of the first $\log_2(N)$ counter bits, thus negating the impact of the previous 0 to N−1 increments in anticipation of carry operations to higher order counter bits. Simulations based on such an approximated computation may suggest use of a different effective value of N, relative to the results obtained with the previously described embodiment.

One such embodiment observes the output of the counter after a statistically valid number of measurement decisions have been made; if the counter has incremented to the point that its MSB is set, (or in a variant embodiment, that a "sticky" counter overflow flag has been set by a carry overflow of the incrementing counter), the number of below-threshold decisions is known to have exceeded the approximated target ratio, and the VGA gain may be increased. If the MSB or counter overflow flag remains cleared, there have been sufficient above-threshold decisions (which clear the lower counter bits and thus suppresses the incrementing of higher order counter bits) to keep the overall counter value small, thus the approximated target ratio was not exceeded and the VGA gain may be reduced.

Figure 3:
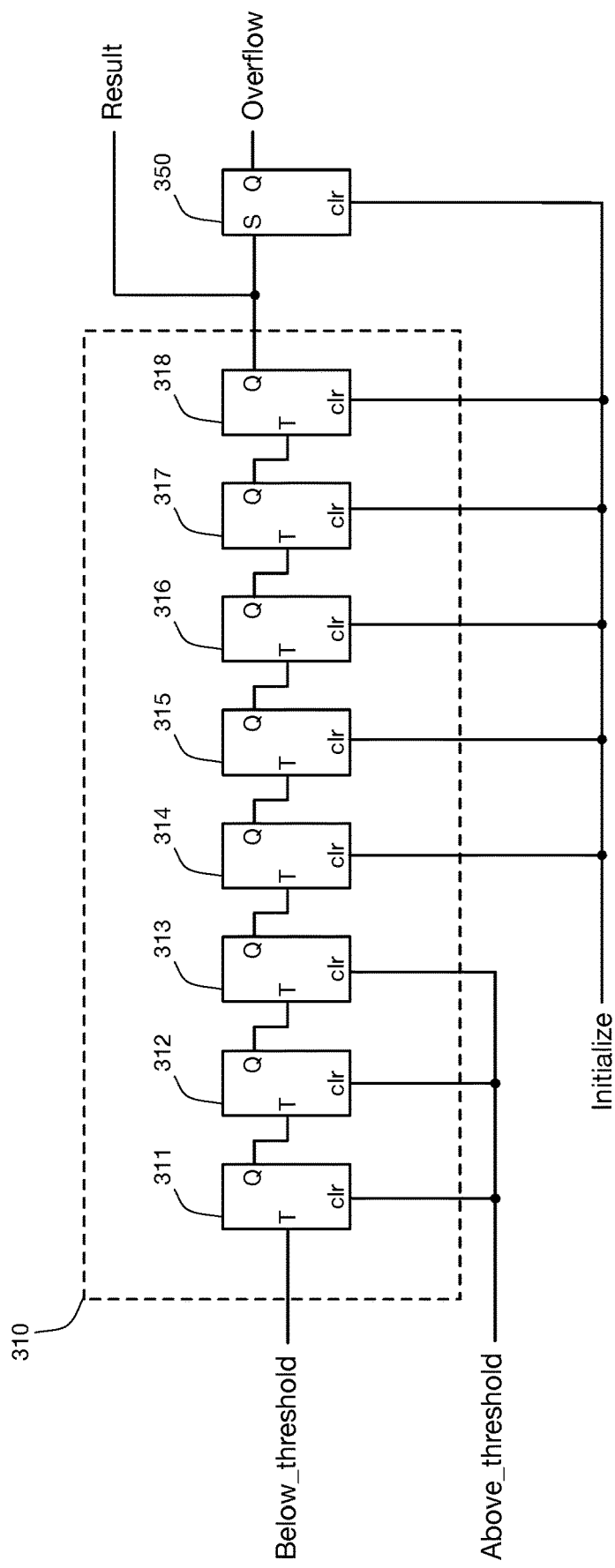
FIG. 3 is a block diagram of an alternative embodiment of a counting register.

FIG. 3 is block diagram illustrating one embodiment of this counter logic. As in the previous example, counter 310 is implemented as a collection of flip-flops 311, 312, 313, 314, 315, 316, 317, 318. For descriptive simplicity a ripple-carry counter is shown, without implying limitation. Counter flip-flops are interconnected by simple cascading increment signals as well understood in the art. "Below threshold" decision 330 acts upon the least-significant bit 311 of counter 310, initiating an overall counter increment or "count up" operation. For each eight such count up operations, the sub-counter comprised of 311, 312, 313 will overflow, causing the sub-counter comprised of 314 through 318 to increment or count up. "Above threshold" decision 350 resets 311, 312, 313, postponing any sub-counter overflow until the sub-counter increments eight more times. The measurement procedure may observe the sign of the most-significant counter bit 318 as a result; in embodiments in which the counter may wrap, producing an erroneous result, an additional flip-flop 350 may be used as a carry-overflow flag, being set by counter bit 318 going high, and remaining high regardless of further changes to 318 until the counter is reinitialized at the start of another measurement procedure. Further embodiments may preset or initialize the counter to a chosen value somewhere between zero and ½ of its maximum count, to control how quickly carry propagation to the counter MSB will occur. Some embodiments may assign fewer or more than three counter bits to the prescaling (and thus, the periodically resetting) sub-counter portion of the counter. Some embodiments may incorporate fewer or more than the example number of stages in its overall size.

In some embodiments, a set of MSBs of one of the counting registers of e.g., FIGS. 2 and 3 may be used as a multi-bit gain feedback control signal for a gain setting of the VGA. For example, one particular embodiment may utilize counter bits at the output of flip-flops 216, 217, and 218 as a three-bit gain feedback control signal to control the gain setting of the VGA. In some embodiments, a number of counting elements e.g., flip-flops 214 and 215 may be present between the MSB portion of the counting register and the first and second positions (e.g., 211 and 213) to low-pass filter the accumulation of positive "above-threshold" decisions to negative "below-threshold" decisions.

In situations where the initial target top-of-eye value cannot be achieved using the maximum (or minimum, if the signal is too large) amount of input gain that is configurable, an alternative embodiment may be used. In such embodiments, it is important to know the actual top of eye measurement to set the correct value for H1. One such embodiment includes setting the gain to a fixed level (e.g., the maximum level, and incrementally adjusting the sampler offset down (or up depending on how the decision threshold is applied) until the target ratio is achieved. Thus, if maximum gain cannot achieve a target 1:8 ratio at a threshold level of 200 mV, the described alternative approach might find that a 1:8 ratio at maximum gain may be achieved at a decision threshold level of 140 mV. Subsequent receive configuration computations, such as of DFE compensation parameters including H1, may be revised accordingly to permit normal operation to occur.

As will be readily apparent, the described methods and apparatus may be equally well applied to measurement of the lower extent of a time-varying information signal, e.g. by reversing the above-threshold and below-threshold decision results in the previous descriptions. Embodiments incorporating multiple samplers may perform multiple measurements simultaneously using different thresholds, as one example to simultaneously determine upper and lower signal bounds.

Sampler Offset Correction without CDR

In some embodiments, a similar method may be performed to perform sampler offset correction without CDR. In at least one embodiment, the method includes adjusting a decision threshold of a data sampler connected to a VGA having a fixed gain setting. The decision threshold of the data sampler is adjusted according to a similar control filter described above, however, a 1:1 target ratio is desired as opposed to an arbitrary 1:N ratio. That is to say, on average the number of decisions above the sampler decision threshold is equal to the number of decisions below the sampler decision threshold. The sampler is configured to asynchronously sample the information signal and to responsively generate decisions including (i) decisions indicating that the information signal is above the decision threshold of the sampler and (ii) decisions indicating that the information signal is below the decision threshold of the sampler. A counting register may increment or decrement a position of the register responsive to decisions generated by the sampler. In some embodiments, the counting register may update responsive to every decision generated by the sampler. Alternatively, the counting register may perform updates more periodically, depending on data speeds and other factors. Such periodic updates may be every kth decision generated by the sampler, or randomly according to e.g., an asynchronous clock signal. Periodic updates may assist in providing a low-pass filtering function as well as updates are less frequent.

A section of bits of the counting register may control the decision threshold of the sampler, whereas in the previous example of the VGA gain adaptation, the counting register controlled a gain setting of the VGA. The decision threshold may be periodically updated according to the decisions until the ratio of decisions above the decision threshold to decisions below the threshold is approximately 1:1, indicating that the decision threshold has been set to the vertical center of the eye.

Figure 7:
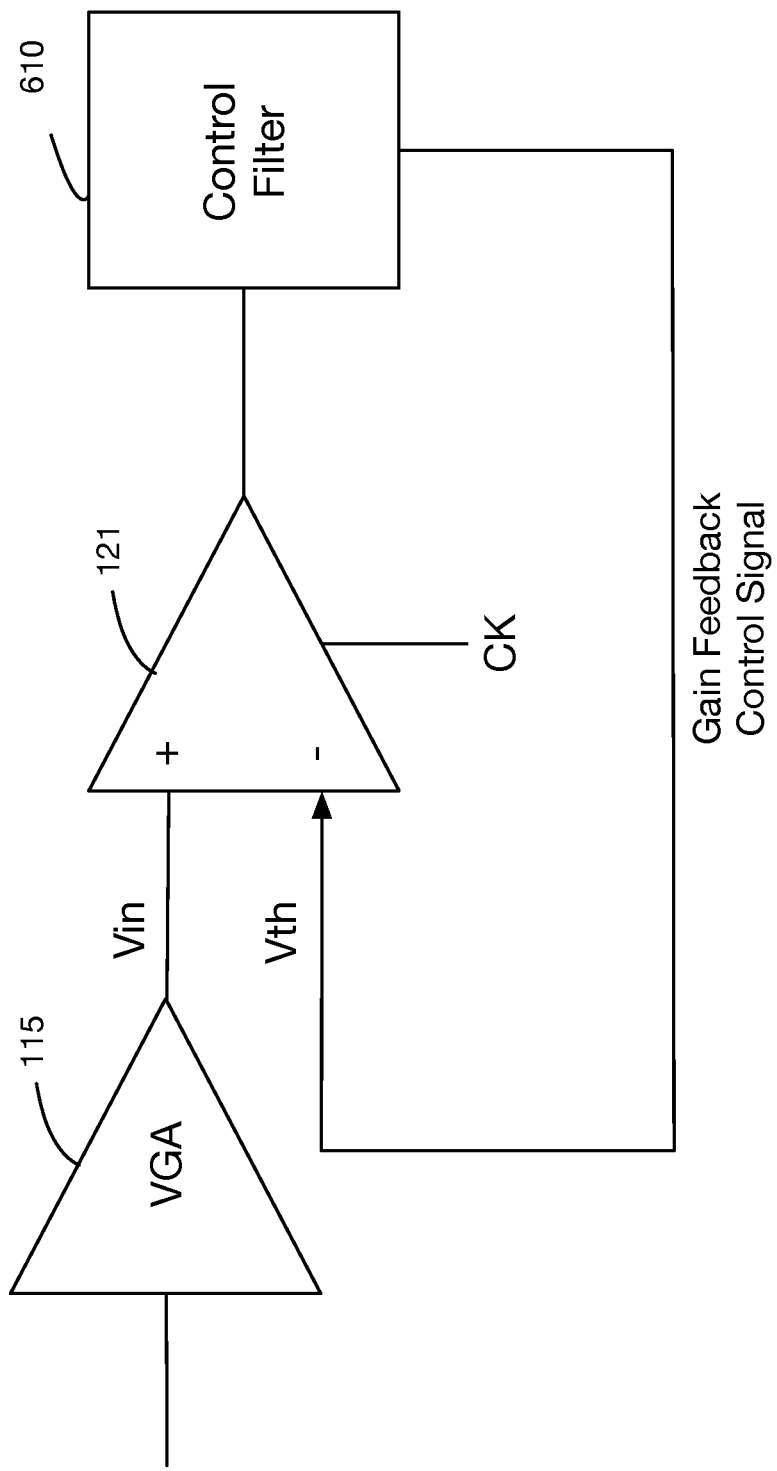
FIG. 7 is a block diagram of an apparatus for sampler offset calibration without CDR, in accordance with some embodiments.

FIG. 7 illustrates a block diagram for performing sampler offset correction without CDR, in accordance with some embodiments. As shown, the sampler 121 is configured to generate decisions indicating the time-varying information signal Vin from the VGA is either above or below the decision threshold Vth. The time-varying information signal is asynchronously sampled until the number of decisions indicating that the time-varying information signal Vin is above the threshold Vth to decisions indicating that the time-varying information signal Vin is below the threshold Vth is approximately 1:1, indicating that the decision threshold Vth has been set to the vertical center of the eye. The control filter 710 in FIG. 7 may include similar counting registers as shown in FIGS. 2 and 3, however the counting registers may be configured with a 1:1 ratio, and the output of the counting register may be provided to adjust the sampler threshold, rather than the gain setting of the VGA.

I claim:

1. A method comprising:
   generating a time-varying information signal at an output of a variable gain amplifier (VGA);
   sampling, using a sampler having a vertical decision threshold associated with a target signal amplitude, the time-varying information signal asynchronously to generate a sequence of decisions from varying sampling instants in sequential signaling intervals, the sequence of decisions comprising (i) positive decisions indicating the time-varying information signal is above the target signal amplitude and (ii) negative decisions indicating the time-varying information signal is below the target signal amplitude;
   accumulating a ratio of positive decisions to negative decisions; and generating a gain feedback control signal to adjust a gain setting of the VGA responsive to a mismatch of the accumulated ratio with respect to a target ratio.

2. The method of claim 1, wherein sampling the time-varying information signal asynchronously comprises sampling the time-varying information signal using a sampling clock that has a frequency offset with respect to the time-varying information signal.

3. The method of claim 2, wherein the sampling clock has a frequency that is approximately 80% of a baud rate of the time-varying information signal.

4. The method of claim 1, wherein sampling the time-varying information signal asynchronously comprises sampling the time-varying information signal randomly.

5. The method of claim 1, wherein accumulating the ratio of positive decisions to negative decisions comprises modifying a counting register.

6. The method of claim 5, wherein modifying the counting register comprises modifying a first position of the counting register in response to each positive decision and modifying a second position of the counting register in response to each negative decision, the first and second positions modified in opposite directions.

7. The method of claim 6, wherein the first and second positions of the counting register are associated with the target ratio.

8. The method of claim 7, wherein the target ratio is a 1:N ratio, and wherein the first and second positions are separated by $\text{Log}_2(N)$ positions.

9. The method of claim 5, wherein the gain feedback control signal corresponds to a multi-bit signal corresponding to a most-significant bit (MSB) portion of the counting register.

10. The method of claim 9, wherein the counting register comprises one or more positions between the MSB portion of the counting register and the first and second positions for low pass filtering the gain feedback control signal.

11. An apparatus comprising:
a variable gain amplifier (VGA) configured to generate a time-varying information signal;
a sampler having a vertical decision threshold associated with a target signal amplitude configured to asynchronously sample the time-varying information signal to generate a sequence of decisions from varying sampling instants in sequential signaling intervals, the sequence of decisions comprising (i) positive decisions indicating the time-varying information signal is above the target signal amplitude and (ii) negative decisions indicating the time-varying information signal is below the target signal amplitude;
a control filter configured to accumulate a ratio of positive decisions to negative decisions, and to responsively generate a gain feedback control signal to adjust a gain setting of the VGA responsive to a mismatch of the accumulated ratio with respect to a target ratio.

12. The apparatus of claim 11, wherein the sampler is configured to asynchronously sample the time-varying information signal using a sampling clock that has a frequency offset with respect to the time-varying information signal.

13. The apparatus of claim 12, wherein the sampling clock has a frequency that is approximately 80% of a baud rate of the time-varying information signal.

14. The apparatus of claim 11, wherein the sampler is configured to randomly sample the time-varying information signal.

15. The apparatus of claim 11, wherein the control filter comprises a counting register configured to accumulate the ratio of positive decisions to negative decisions.

16. The apparatus of claim 15, wherein the counting register is configured to modify a first position of the counting register in response to each positive decision and to modify a second position of the counting register in response to each negative decision, the first and second positions modified in opposite directions.

17. The apparatus of claim 16, wherein the first and second positions of the counting register are associated with the target ratio.

18. The apparatus of claim 17, wherein the target ratio is a 1:N ratio, and wherein the first and second positions are separated by $\text{Log}_2(N)$ positions.

19. The apparatus of claim 15, wherein the gain feedback control signal corresponds to a multi-bit signal corresponding to a most-significant bit (MSB) portion of the counting register.

20. The apparatus of claim 11, further comprising generating an analog gain feedback control signal from the multi-bit signal.

* * * * *